(12) United States Patent
Heo et al.

(10) Patent No.: US 10,090,389 B2
(45) Date of Patent: Oct. 2, 2018

(54) SEMICONDUCTOR MEMORY DEVICE AND FABRICATION METHOD THEREOF

(71) Applicants: Hoon Heo, Seoul (KR); Gachon University of Industry-Academic cooperation Foundation, Seongnam-si, Gyeonggi-do (KR)

(72) Inventors: Hoon Heo, Seoul (KR); Seongjae Cho, Seoul (KR)

(73) Assignee: Gachon University of Industry-Academic Cooperation Foundation (KR)

( * ) Notice: Subject to any disclaimer, the term of this patent is extended or adjusted under 35 U.S.C. 154(b) by 0 days.

(21) Appl. No.: 15/696,217

(22) Filed: Sep. 6, 2017

(65) Prior Publication Data
US 2018/0114840 A1    Apr. 26, 2018

(30) Foreign Application Priority Data

Oct. 25, 2016 (KR) .................. 10-2016-0139226
Feb. 22, 2017 (KR) .................. 10-2017-0023568

(51) Int. Cl.
| | |
|---|---|
| H01L 27/32 | (2006.01) |
| H01L 29/36 | (2006.01) |
| H01L 27/115 | (2017.01) |
| H01L 29/68 | (2006.01) |
| H01L 27/11 | (2006.01) |
| H01L 27/108 | (2006.01) |

(52) U.S. Cl.
CPC .......... *H01L 29/36* (2013.01); *H01L 27/115* (2013.01); *H01L 29/685* (2013.01); *H01L 27/108* (2013.01); *H01L 27/11* (2013.01)

(58) Field of Classification Search
None
See application file for complete search history.

(56) References Cited

U.S. PATENT DOCUMENTS

| | | | | |
|---|---|---|---|---|
| 3,725,881 | A * | 4/1973 | Dellor | G11C 11/411 257/E27.07 |
| 4,323,986 | A * | 4/1982 | Malaviva | G11C 11/39 257/378 |
| 4,729,116 | A * | 3/1988 | Sato | G11C 17/18 365/225.6 |
| 9,013,918 | B2 * | 4/2015 | Liang | H01L 27/1027 365/174 |
| 9,281,217 | B1 * | 3/2016 | Jung | H01L 21/47573 |
| 9,570,683 | B1 * | 2/2017 | Jo | G11C 13/0004 |
| 9,853,089 | B2 * | 12/2017 | Or-Bach | H01L 27/249 |

(Continued)

*Primary Examiner* — Michael Lebentritt
(74) *Attorney, Agent, or Firm* — Gerald E. Hespos; Michael J. Porco; Matthew T. Hespos

(57) ABSTRACT

A semiconductor memory device and a method of fabrication of the same are provided. The semiconductor memory device comprises a two-terminal memory cell sequentially joined together with a first high concentration doping region doped with a first conductive dopant, a second base region doped with a second conductive type dopant, a first base region doped with the first conductive type dopant, and a second high concentration doping region doped with the second conductive type dopant, wherein a write voltage of the memory cell is controlled by adjusting the lengths or doping concentrations of the first and second base regions.

10 Claims, 11 Drawing Sheets

(56) References Cited

U.S. PATENT DOCUMENTS

| | | | | |
|---|---|---|---|---|
| 2005/0110063 A1* | 5/2005 | Huang | ............ | H01L 27/10805 257/296 |
| 2009/0020805 A1* | 1/2009 | Heo | ................ | H01L 21/28202 257/325 |
| 2011/0001183 A1* | 1/2011 | Yoo | ................ | H01L 21/02145 257/324 |

* cited by examiner

SEMICONDUCTOR MEMORY DEVICE AND FABRICATION METHOD THEREOF

CROSS-REFERENCE TO RELATED APPLICATION

This application claims priority to Korean Patent Application Nos. 10-2016-0139226, filed on Oct. 25, 2016, and 10-2017-0023568, filed on Feb. 22, 2017, under 35 U.S.C. 119, the entire contents of which are hereby incorporated by reference.

BACKGROUND

Field of the Invention. The present invention relates to a semiconductor memory device and a fabrication method thereof, and more particularly to a semiconductor memory device comprising memory cells with a write voltage controlled by adjusting lengths and doping concentrations of base regions and a fabricating method of the same.

Description of the Related Art A semiconductor memory device is a device used for storing information and is an apparatus that enables human memory and recording ability to be realized by electronic means. The semiconductor memory devices are useful for constructing circuits because they can easily enable to turn on and off electricity even by low power. Currently, most electronic devices such as computers, smart phones and the like use semiconductor memories.

However, recently, as the fourth industrial revolution such as an artificial intelligence (AI) and an autonomous driving automobile has begun, the demand for an ultra high performance memory has exploded. But, the development of semiconductor memory devices has been limited due to the limitations of the fine processing technology. This deteriorates the overall performance of the electronic devices determined by the performance of the semiconductor memory device.

Accordingly, there is a need of techniques for improving the performance of semiconductor memory devices.

SUMMARY

An object of the present invention is to provide a semiconductor memory device having a controlled write voltage.

Another object of the present invention is to provide a semiconductor memory device having an improved integration.

Another object of the present invention is to provide a semiconductor memory device having a reduced size.

Another object of the present invention is to provide a fabricating method of a semiconductor memory device with a simplified fabricating process.

The other object of the present invention is to provide a fabricating method of a semiconductor memory device with an improved process yield.

The technical problem to be solved by the present invention is not limited to the mentioned above.

To achieve the objects, the present invention provides a semiconductor memory device.

According to one embodiment, a semiconductor memory device comprises a two-terminal memory cell sequentially joined together with a first high concentration doping region doped with a first conductive type dopant, a second base region doped with a second conductive type dopant, a first base region doped with the first conductive type dopant, and a second high concentration doping region doped with the second conductive type dopant, wherein a write voltage of the memory cell is controlled by adjusting the lengths or doping concentrations of the first and second base regions.

According to an embodiment, the write voltage of the memory cell may be increased by increasing the lengths or doping concentrations of the first and second base regions.

According to an embodiment, the write voltage of the memory cell may be decreased by decreasing the lengths or doping concentrations of the first and second base regions.

According to an embodiment, a semiconductor memory device comprises an array with a stack of a plurality of the memory cells, wherein the array may be formed by alternately and repeatedly stacking the memory cell with an insulating film.

According to an embodiment, the memory cells in the array may comprise a first memory cell and a second memory cell on the first memory cell, wherein the lengths of the first base regions of the first and second memory cells are different from each other and the lengths of the second base regions of the first and second memory cells are different from each other.

According to an embodiment, the memory cells in the array may comprise a first memory cell and a second memory cell on the first memory cell, wherein the doping concentrations of the first base regions of the first and second memory cells are different from each other and the doping concentrations of the second base regions of the first and second memory cells are different from each other.

According to an embodiment, in a semiconductor memory device a plurality of the arrays may be provided. The plurality of arrays may be arranged laterally spaced apart from each other, and trenches may be provided between the arrays.

According to an embodiment, the plurality of arrays may include first and second arrays adjacent to each other, wherein the lengths of the first base regions of the memory cells in the first array are different from the lengths of the first base regions of the memory cells in the second array, and the lengths of the second base regions of the memory cells in the first array are different from the lengths of the second base regions of the memory cells in the second array.

To achieve the objects, the present invention provides a method for fabricating a semiconductor memory device.

A method for fabricating a semiconductor memory device according to an embodiment of the present invention comprises: a step of preparing a substrate; a step of fabricating a stacked structure by alternately and repeatedly stacking a semiconductor layer with an insulating film on the substrate; and a step of defining a plurality of arrays by etching the stacked structure to be spaced apart from each other by a trench; wherein the semiconductor layer comprises a first high concentration doping region doped with a first conductive type dopant and extended in a first direction, a second base region doped with a second conductive type dopant and extended in the first direction, a first base region doped with a first conductive type dopant and extended in the first direction, and a second high concentration doping region doped with a second conductive type dopant and extended in the first direction, wherein the first high concentration doping region, the second base region, the first base region and the second high concentration doping region are sequentially arranged, and wherein the trench is extended in a second direction that intersects the first direction.

According to an embodiment, each of the arrays may include a plurality of memory cells stacked vertically, each of the memory cells may be sequentially joined together with the first high concentration doping region, the second base region, the first base region and the second high concentration doping region, and a write voltage of each of the memory cells may be controlled by adjusting the lengths or doping concentrations of the first and second base regions A semiconductor memory device according to an embodiment of the present invention has memory cells sequentially joined together with a first high concentration doping region, a second base region, a first base region and a second high concentration doping region and controls a write voltage by adjusting the lengths or doping concentrations of the first and second base regions. Accordingly, a semiconductor memory device used to perform two-terminal operation and to include memory cells with a write voltage controlled by applications can be provided.

And a semiconductor memory device according to an embodiment of the present invention has a stacked structure formed by alternately and repeatedly stacking the memory cell with a plurality of insulating films. A semiconductor memory device can improve integration by the stack of the memory cells with spacing apart from each other.

Figure 1:
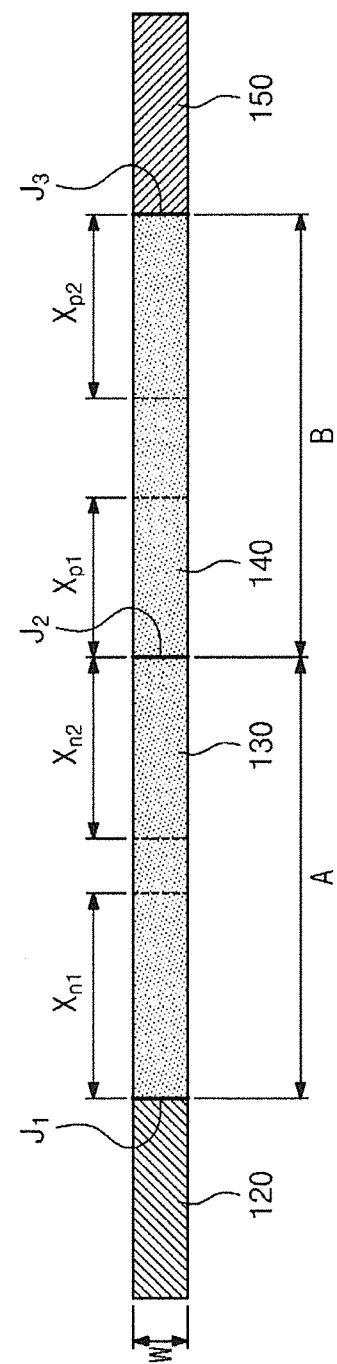
FIG. 1 is a view showing a memory cell according to an embodiment of the present invention.

In these drawings, the following reference numbers are used throughout: reference number 110 indicates a substrate, 120 a first high concentration doping region, 130 a second base region, 140 a first base region, 150 a second high concentration doping region, 160 an insulating film, 1100 an electronic system, 1110 a controller, 1120 an input/output device (I/O), 1130 and 1210 a memory device, 1140 an interface, 1150 a bus, 1200 a memory card, 1220 a memory controller or a controller 1221 a static random access memory (SRAM), 1222 a central processing unit (CPU), 1223 a host interface or a host I/F, 1224 an error correction block code (ECC), 1225 a memory interface or a memory I/F, A a length of a second base region, B a length of a first base region, $J_1$, $J_2$ and $J_3$ a junction and $x_{n1}$, $x_{n2}$, $x_{p1}$ and $x_{p2}$ a width of a depletion region.

DETAILED DESCRIPTION

Hereinafter, detailed descriptions of preferred embodiments of the present invention are provided with reference to accompanying drawings. However, the technical idea of the present invention is not limited to the embodiments described herein, but may be embodied in other forms. Rather, these embodiments disclosed herein are provided so that this disclosure is thorough and complete and fully convey the idea of the present invention to those skilled in the art.

In this specification, when an element is referred to as being on another element, it may be directly formed on another element or a third element may be interposed therebetween. Further, in the drawings, the thicknesses of the films and regions are exaggerated for an effective description of the technical content.

Although the terms first, second, third, etc. in the various embodiments of this specification may be used to describe various elements, these elements should not be limited by these terms. These terms may be only used to distinguish one element from another element. Thus, a first element in any one embodiment could be termed a second element in another embodiment. Each embodiment described and exemplified herein also includes its complementary embodiment. Also, in this specification, the term "and/or" is used to include at least one of the before and after listed elements.

In this specification, the singular forms may be intended to include the plural forms as well unless the context clearly indicated otherwise. The terms "comprises", "comprising", "including" and "having" specify the presence of stated features, integers, steps, elements or combinations thereof in this specification, but should not be understood to preclude the presence or addition of one or more other features, integers, steps, elements or combinations thereof.

In the following description, well-known functions or constructions are not described in detail to avoid unnecessarily obscuring the subject matter of the present invention.

FIG. 1 is a view showing a memory cell according to an embodiment of the present invention.

Figure 2:
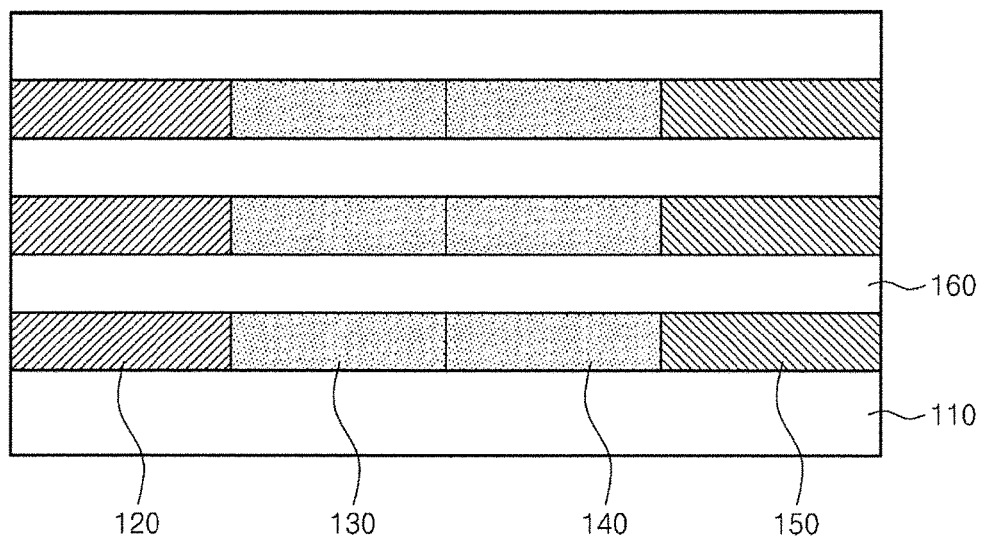
FIG. 2 is a cross sectional view of an array including memory cells according to an embodiment of the present invention.
Figure 3:
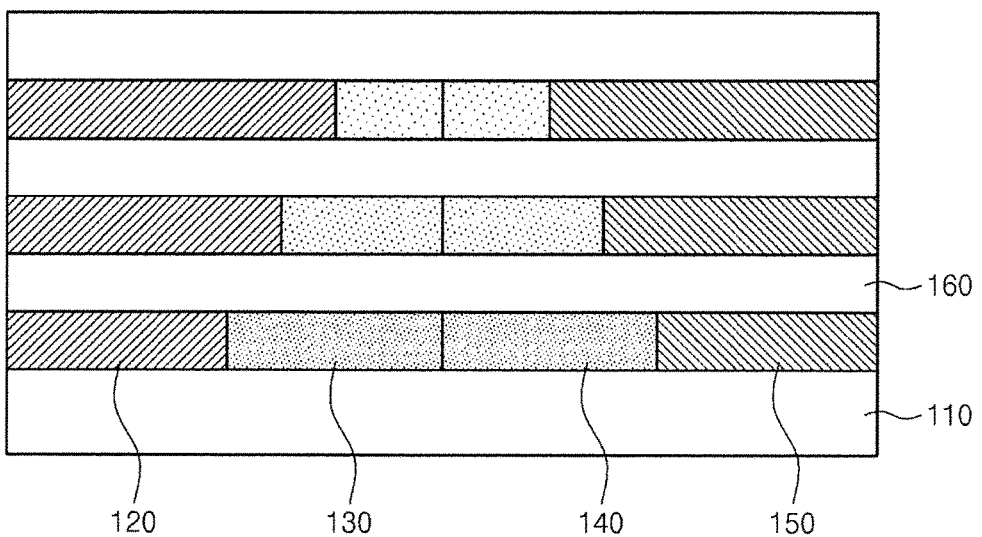
FIG. 3 is a cross sectional view of a modified array including memory cells according to an embodiment of the present invention.

With reference to FIG. 1, a memory cell can comprise a structure sequentially, especially horizontally, joined together with a first high concentration doping region 120, a second base region 130, a first base region 140, and a second high concentration doping region 150. Here, the memory cell horizontally and sequentially joined together with the regions 120, 130, 140 and 150 has the merits of being vertically stacked as shown in FIGS. 2 and 3 and enabling the the regions to vary in a length and a doping concentration to determine its write voltage without any influence on the other memory cells in the other layers as shown in FIG. 3.

The first high concentration doping region 120 is doped with a first conductive type dopant to be a high concentration. According to an embodiment, the first conductive type dopant can be a P-type dopant and the first high concentration doping region 120 can be a P+ region.

The second base region 130 is doped with a second conductive type dopant. According to an embodiment, the second conductive type dopant can be an N-type dopant and the second base region 130 can be an N-type base region.

The first base region 140 is doped with the first conductive type dopant to be a lower concentration than the first high concentration doping region 120. According to an embodiment, the first conductive type dopant can be the P-type dopant and the first base region 140 can be a P-type base region.

The second high concentration doping region 150 is doped with the second conductive type dopant to be a higher concentration than the second base region 130. According to an embodiment, the second conductive type dopant can be the N-type dopant and the second high concentration doping region 150 can be an N+ region.

For example, the first high concentration doping region 120 can be a P+ Anode, the second base region 130 can be an N-type base, the first base region 140 can be a P-type base, and the second high concentration doping region 150 can be an N+ Cathode.

In the above embodiment, when a forward voltage is applied to both ends of the memory cell, namely, the P+ Anode 120 and the N+ Cathode 150, a forward voltage is applied to a junction $J_1$ between the first high concentration doping region 120 and the second base region 130 and to a junction $J_3$ between the first base region 140 and the second high concentration doping region 150 and a reverse voltage is applied to a junction $J_2$ between the second base region 130 and the first base region 140.

At this time, the size of the depletion region formed in each of the junctions $J_1$, $J_2$, and $J_3$ varies depending on the voltage applied to each junction.

Accordingly, as shown in FIG. 1, $x_{n1}$ and $x_{n2}$ are the sizes of the depletion regions formed from the junctions $J_1$ and $J_2$, respectively, in the second base region 130 (N-type base) having length A and $x_{p1}$ and $x_{p2}$ are the sizes of the depletion regions formed from the junctions $J_2$ and $J_3$, respectively, in the first base region 140 (P-type base) having length B. When the following equations 1 and 2 are satisfied according to the applied voltage, punch-through can be generated in the second base region 130 (N-type base) and the first base region 140 (P-type base).

$$x_{n1}+x_{n2}=A \quad (1)$$

$$x_{p1}+x_{p2}=B \quad (2)$$

When a voltage is applied to the memory cell and punch-through is generated in the second base region 130 or the first base region 140, the holes and electrons injected into the memory cell are rapidly increased. Namely, holes are rapidly increased in the second base region 130 (N-type base) and electrons are rapidly increased in the first base region 140 (P-type base). When a sufficient number of holes and electrons are accumulated in the memory cell, the junction $J_2$ between the second base region 130 and the first base region 140 is immediately flipped from a reverse bias state to a forward bias state so that a current can flow through the memory cell.

According to an embodiment, the length A of the second base regions 130 and the length B of the first base region 140 can be adjusted to control the write voltage of the memory cell. For example, when the length A of the second base regions 130 and the length B of the first base region 140 are increased, the write voltage of the memory cell can be increased. In another example, when the length A of the second base regions 130 and the length B of the first base region 140 are decreased, the write voltage of the memory cell can be decreased.

According to an embodiment, the doping concentrations of the second base regions 130 and the first base region 140 can be adjusted to control the write voltage of the memory cell.

For example, when the doping concentrations of the second base regions 130 and the first base region 140 are increased, the write voltage of the memory cell can be increased. Specifically, when the doping concentrations of the second base regions 130 and the first base region 140 are increased, the lengths $x_{p1}$, $x_{p2}$, $x_{n1}$ and $x_{n2}$ of the depletion regions are decreased. Accordingly, for satisfying the above equations 1 and 2 and generating punch-through in the second base region 130 and/or the first base region 140, the write voltage of the memory cell can be increased.

In another example, when the doping concentrations of the second base regions 130 and the first base region 140 are decreased, the write voltage of the memory cell can be decreased. Specifically, when the doping concentrations of the second base regions 130 and the first base region 140 are decreased, the lengths $x_{p1}$, $x_{p2}$, $x_{n1}$ and $x_{n2}$ of the depletion regions are increased. Accordingly, for satisfying the above equations 1 and 2 and generating punch-through in the second base region 130 and/or the first base region 140, the write voltage of the memory cell can be decreased.

A memory cell according to an embodiment of the present invention comprises the first base region 140 and the second base region 130 and the write voltage of the memory cell can be controlled by adjusting the lengths A and B and doping concentrations of the first base region 140 and the second base region 130.

FIG. 2 is a cross sectional view of an array including memory cells according to an embodiment of the present invention.

With reference to FIG. 2, an array comprises a substrate 110, a plurality of memory cells and a plurality of insulating films and can be a stacked structure formed by alternatively and repeatedly stacking the memory cell with the insulating film 160 on the substrate 110.

The substrate 110 is provided as a support on which the memory cells and the insulating films 160 are stacked. According to an embodiment, the substrate 110 can be a silicon semiconductor substrate.

The memory cell is a structure sequentially joined together with a first high concentration doping region 120, a second base region 130, a first base region 140, and a second high concentration doping region 150 and can be provided as mentioned above in FIG. 1. A plurality of the memory cells is stacked on the substrate 110. According to an embodiment, the lengths and doping concentrations of the first base regions 140 and the second base regions 130 in the plurality of memory cells can be provided equally.

A plurality of the insulating films 160 are stacked on the substrate 110 and can be stacked alternatively with the memory cells on the substrate 110. According to an embodiment, the insulating films 160 can be silicon oxide, silicon nitride, or silicon oxynitride.

FIG. 3 is a cross sectional view of a modified array including memory cells according to an embodiment of the present invention.

With reference to FIG. 3, an array comprises a substrate 110, a plurality of memory cells and a plurality of insulating films and can be a stacked structure formed by alternatively and repeatedly stacking the memory cell with the insulating film 160.

The substrate 110 is a support for stacking the memory cells and the insulating films 160 and can be provided as mentioned above in FIG. 2.

The memory cell is a structure sequentially joined together with a first high concentration doping region 120, a second base region 130, a first base region 140, and a second high concentration doping region 150 and can be provided as mentioned above in FIG. 1. A plurality of the memory cells is stacked on the substrate 110. According to an embodiment, the lengths and doping concentrations of the first base region 140 and the second base region 130 in the plurality of memory cells can be provided differently.

For example, the array comprises a first memory cell and a second memory cell and the length of the first base region 140 of the first memory cell can be longer or shorter than the length of the first base region 140 of the second memory cell. And the length of the second base region 130 of the first memory cell can be longer or shorter than the length of the second base region 130 of the second memory cell. Accordingly, the write voltages of the first and second memory cells can be different from each other. In other words, by adjusting the lengths of the first and second base regions 130 and 140 of the memory cells in one array, the memory cells in the one array can be controlled to get a different write voltage from each other. Thus, a semiconductor memory device applicable to various applications can be provided.

In another example, the array comprises a first memory cell and a second memory cell and the doping concentration of the first base region 140 of the first memory cell can be higher or lower than the doping concentration of the first base region 140 of the second memory cell. And the doping concentration of the second base region 130 of the first memory cell can be higher or lower than the doping concentration of the second base region 130 of the second memory cell. In other words, by adjusting the doping concentrations of the first and second base regions 130 and 140 of the memory cells in one array, the memory cells in the one array can be controlled to get a different write voltage from each other. Thus, a semiconductor memory device applicable to various applications can be provided.

A plurality of the insulating films 160 are stacked on the substrate 110 and can be alternatively stacked with the memory cells on the substrate 110. According to an embodiment, the insulating films 160 can be provided as mentioned above in FIG. 2.

Figure 4A:
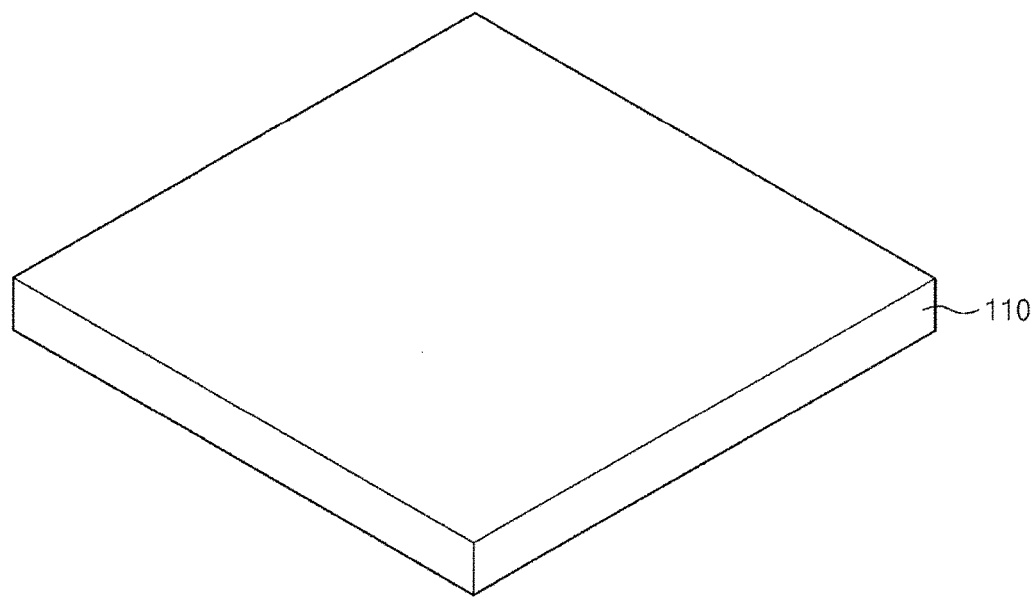
FIGS. 4A to 4G are views for explaining a method for fabricating an array including memory cells according to an embodiment of the present invention.
Figure 4B:
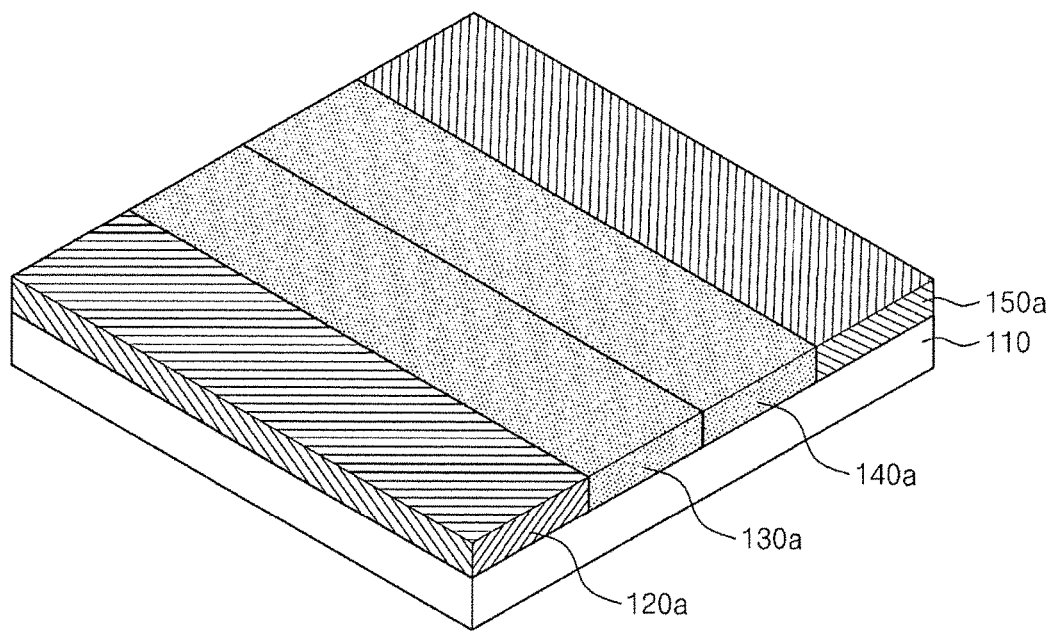
Figure 4C:
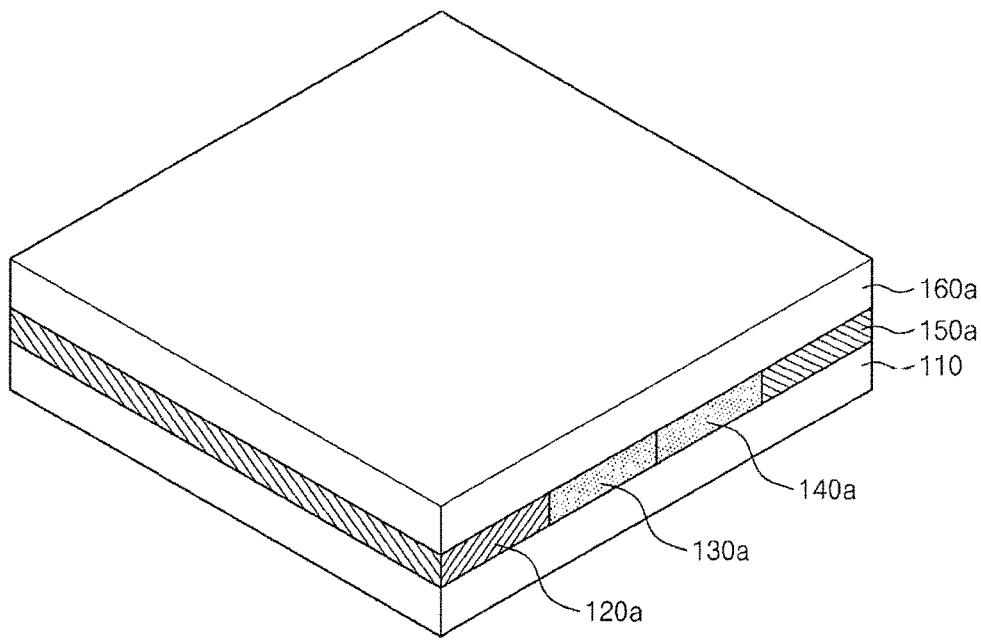
Figure 4D:
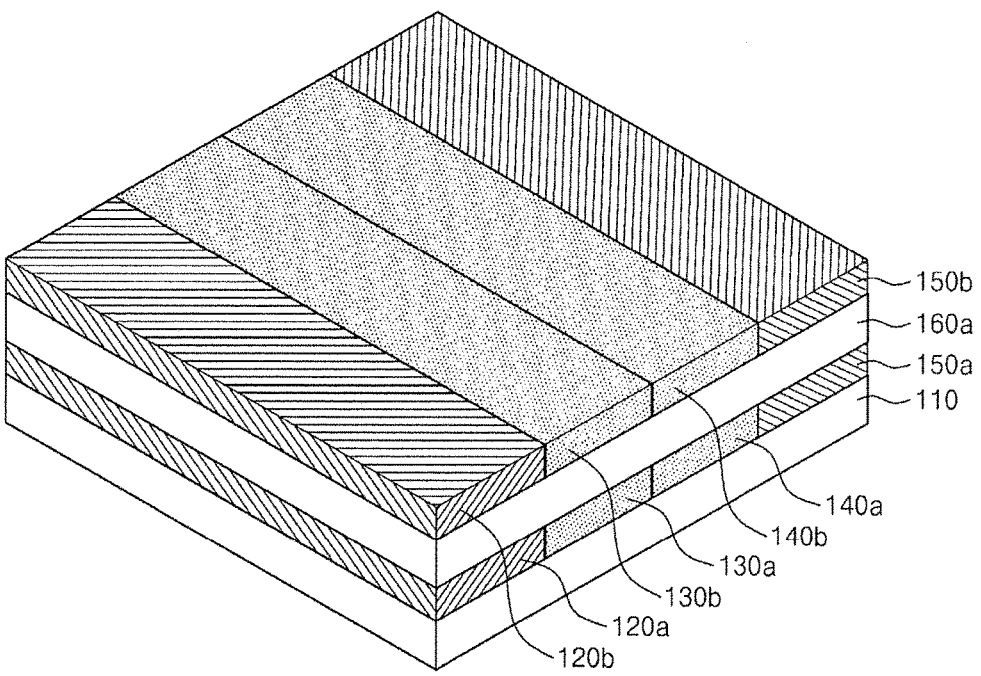
Figure 4E:
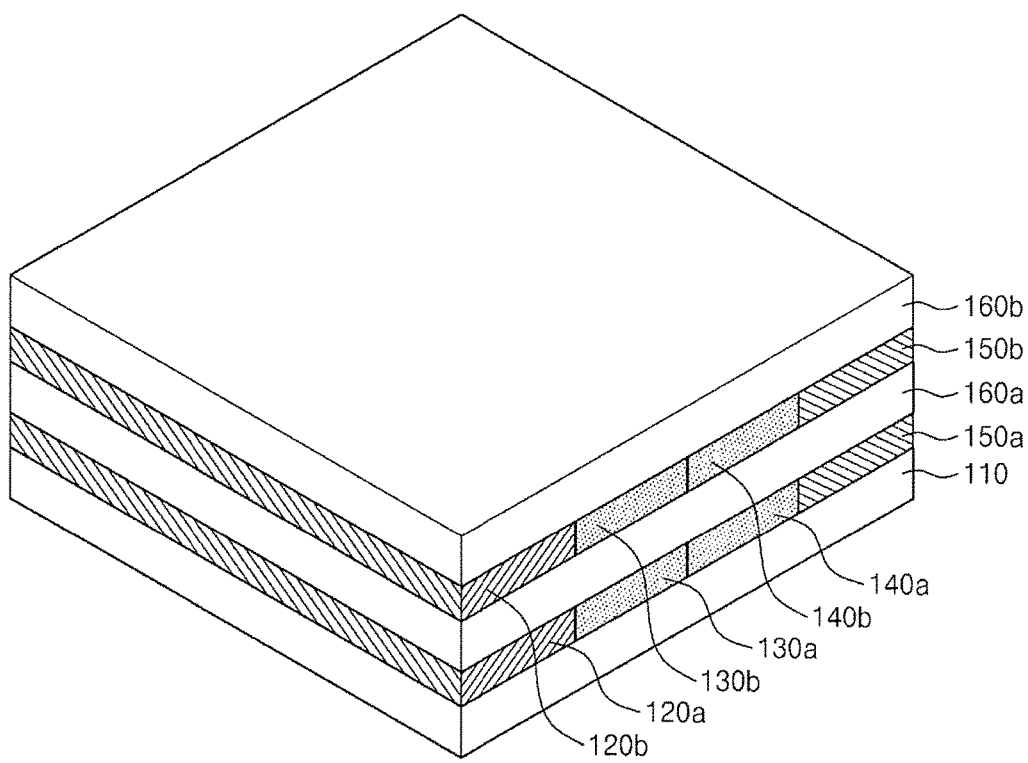
Figure 4F:
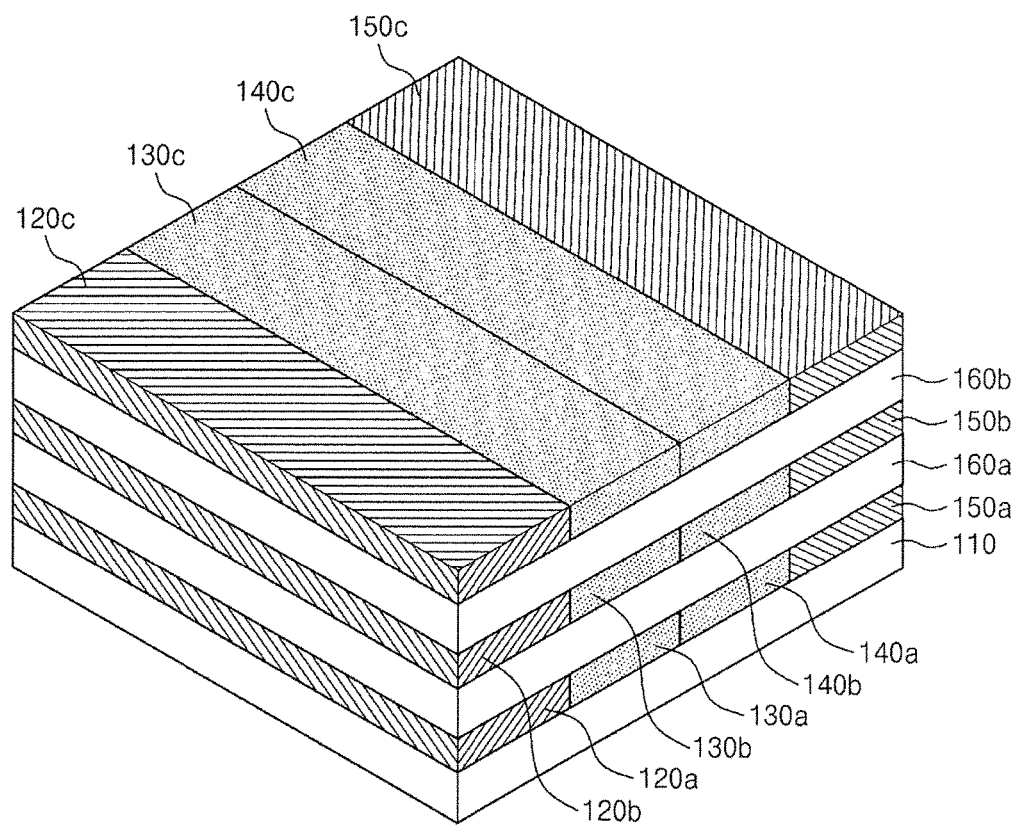
Figure 4G:
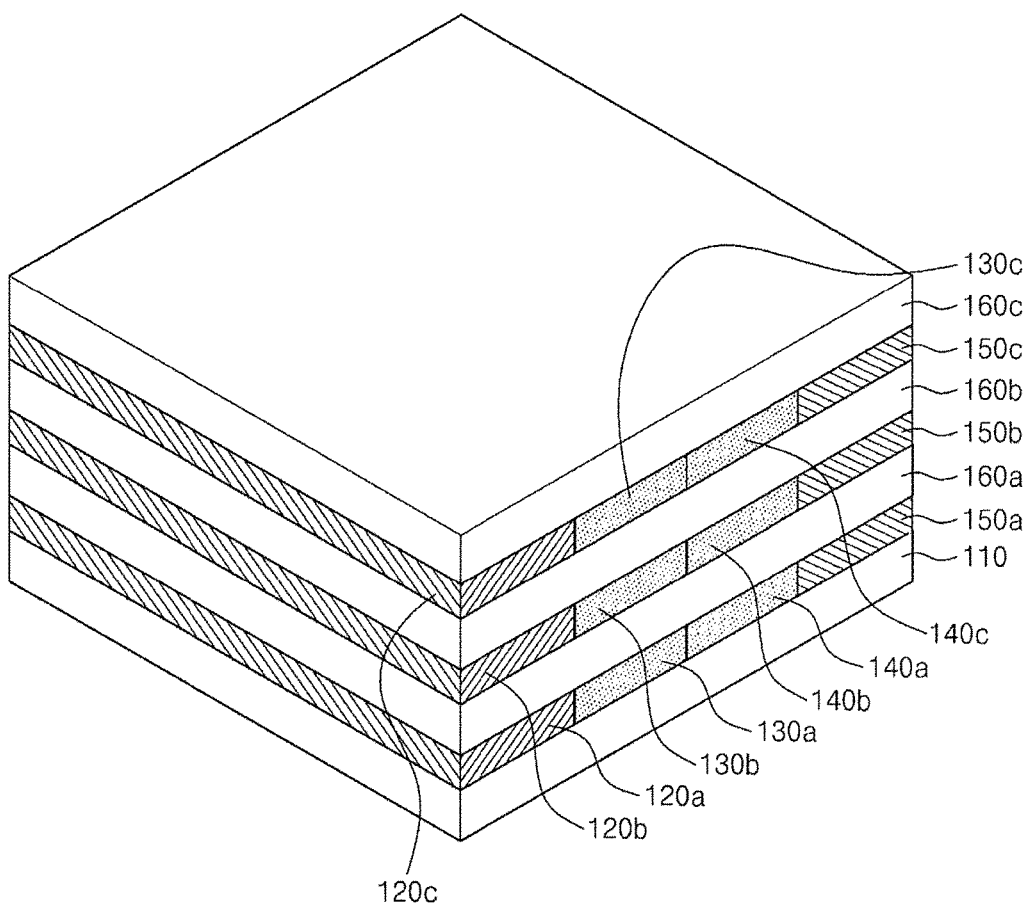
Figure 5:
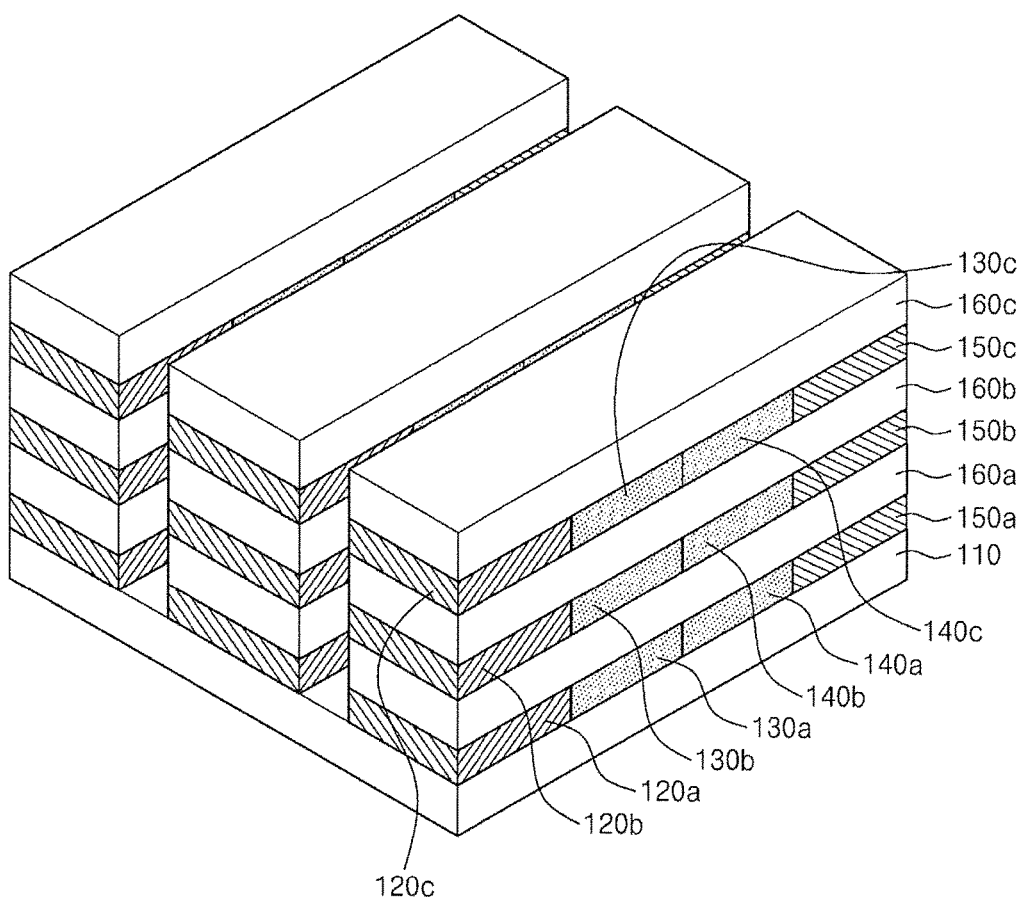
FIG. 5 is a view of a fabricated array according to an embodiment of the present invention.

FIGS. 4A to 4G are views for explaining a method for fabricating an array including memory cells according to an embodiment of the present invention and FIG. 5 is a view of a fabricated array according to an embodiment of the present invention.

With reference to FIG. 4A, a substrate 110 is prepared. A stacked structure formed by alternatively and repeatedly stacking a plurality of memory cells with a plurality of insulating films on the substrate 110 can be provided. According to an embodiment, the substrate 110 can be provided as mentioned above in FIG. 2.

With reference to FIG. 4B, a first semiconductor layer is arranged on the substrate 110. The first semiconductor layer is a structure extended in a first direction and sequentially joined together with a first high concentration doping region 120a, a second base region 130a, a first base region 140a, and a second high concentration doping region 150a and can be provided as mentioned above in FIGS. 1 to 3.

As shown in FIG. 4B, the first high concentration doping region 120a, the second base region 130a, the first base region 140a, and the second high concentration doping region 150a can be extended in the first direction in parallel and can have an equal width. As mentioned below with reference to FIG. 5, when a trench is formed, the widths of the first high concentration doping region 120a, the second base region 130a, the first base region 140a, and the second high concentration doping region 150a in one memory cell can be defined as the lengths of the first high concentration doping region 120a, the second base region 130a, the first base region 140a, and the second high concentration doping region 150a, respectively. In other words, by adjusting the widths of the second base region 130a and the first base region 140a of the first semiconductor layer, the lengths of the second base region 130a and the first base region 140a of the semiconductor layer of the memory cell can be controlled. Consequently, a write voltage of the memory cell can be controlled.

With reference to FIG. 4C, a first insulating film 160a is arranged on the first semiconductor layer. The first insulating film 160a can be provided as mentioned above in FIG. 2.

With reference to FIG. 4D, a second semiconductor layer is arranged on the first insulating film 160a. The second semiconductor layer is a structure extended in a first direction and sequentially joined together with a first high concentration doping region 120b, a second base region 130b, a first base region 140b, and a second high concentration doping region 150b and can be provided as mentioned above in FIGS. 1 to 3.

According to an embodiment, the first base region 140b and the second base region 130b in the second semiconductor layer can have the same lengths (in a direction perpendicular to the first direction) or doping concentrations of the first base region 140a and the second base region 130a in the first semiconductor layer, respectively.

According to another embodiment, the first base region 140b and the second base region 130b in the second semiconductor layer can have the different lengths (in a direction perpendicular to the first direction) or doping concentrations of the first base region 140a and the second base region 130a in the first semiconductor layer, respectively.

With reference to FIG. 4E, a second insulating film 160b is arranged on the second semiconductor layer. The second insulating film 160b can be provided as mentioned above in FIG. 2.

With reference to FIG. 4F, a third semiconductor layer is arranged on the second insulating film 160b. The third semiconductor layer is a structure extended in a first direction and sequentially joined together with a first high concentration doping region 120c, a second base region 130c, a first base region 140c, and a second high concentration doping region 150c and can be provided as mentioned above in FIGS. 1 to 3.

According to an embodiment, the first base region 140c and the second base region 130c in the third semiconductor layer can have the same lengths (in a direction perpendicular to the first direction) or doping concentrations of the first base region 140a and the second base region 130a in the first semiconductor layer or of the first base region 140b and the second base region 130b in the second semiconductor layer, respectively.

According to another embodiment, the first base region 140c and the second base region 130c in the third semiconductor layer can have the different lengths (in a direction perpendicular to the first direction) or doping concentrations of the first base region 140a and the second base region 130a in the first semiconductor layer or of the first base region 140b and the second base region 130b in the second semiconductor layer, respectively.

With reference to FIG. 4G, a third insulating film 160c is arranged on the third semiconductor layer. The third insulating film 160c can be provided as mentioned above in FIG. 2.

With reference to FIG. 5, by etching the stacked structure formed by alternatively stacking the first to third semiconductor layers with the first to third insulating films 160a, 160b and 160c, trenches can be formed between a plurality of arrays.

Specifically, the first high concentration doping regions 120a, 120b and 120c, the second base regions 130a, 130b and 130c, the first base regions 140a, 140b and 140c, and the second high concentration doping regions 150a, 150b and 150c in the first to third semiconductor layers can be extended in the first direction and the trenches can be extended in a second direction that intersects the first direction.

A semiconductor memory device having the plurality of arrays arranged laterally spaced apart from each other and trenches provided between the plurality of arrays can be fabricated by gap-filling the trenches with an insulating material.

In FIG. 4B, the first high concentration doping region 120a, the second base region 130a, the first base region 140a, and the second high concentration doping region 150a are drawn to extend in the first direction with the same width, respectively. However, according to one modification, in the semiconductor layer, the widths of the first high concentration doping region 120a and the second high concentration doping region 150a can be extended to be gradually widened or narrowed. In this case, in the semiconductor layer, the widths of the second base region 130a and the first base region 140a can be gradually narrowed or widened, respectively. Accordingly, when the array is fabricated by the methods described with reference to FIGS. 4C to 4G and FIG. 5, in the arrays adjacent to each other, the widths of the first base regions and the second base regions of the memory cells located at the same layer can be different from each other (for example, FIGS. 2 and 3). Thus, a semiconductor memory device having a different write voltage for each array can be fabricated.

Figure 6:
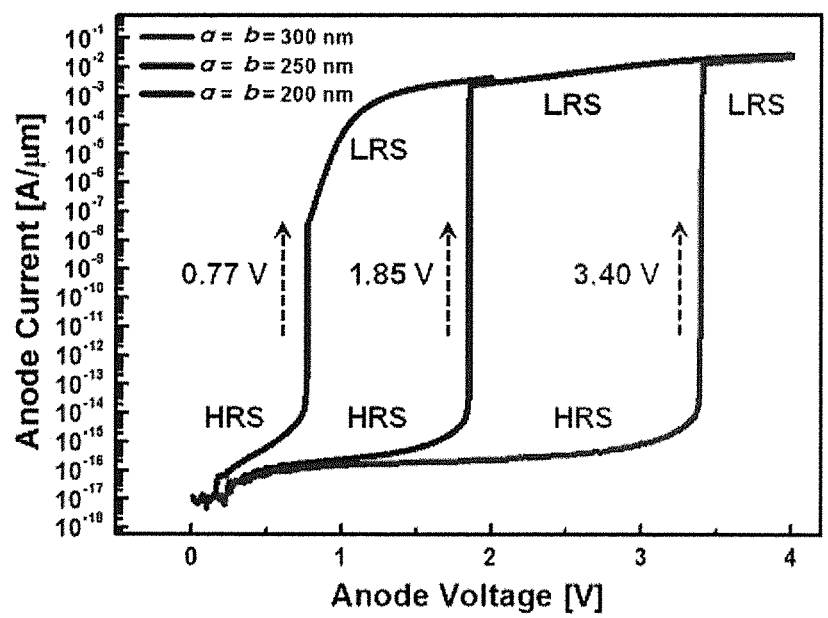
FIG. 6 is a write voltage measurement graph depending on lengths of first and second base regions of a memory cell according to an embodiment of the present invention.

FIG. 6 is a write voltage measurement graph depending on lengths of first and second base regions of a memory cell according to an embodiment of the present invention.

With reference to FIG. 6, the write voltage changes of the memory cells having different lengths of the first base region and the second base region were measured.

When a voltage was applied to a memory cell having a length of 200 nm in the first base region and the second base region, respectively, the write voltage of the memory cell was measured to be 0.77 V. When a voltage was applied to a memory cell having a length of 250 nm in the first base region and the second base region, respectively, the write voltage of the memory cell was measured to be 1.85 V. When a voltage was applied to a memory cell having a length of 300 nm in the first base region and the second base region, respectively, the write voltage of the memory cell was measured to be 3.40 V.

In this manner, the lengths of the first base region and the second base region can be adjusted to control the write voltage of the memory cell.

Figure 7:
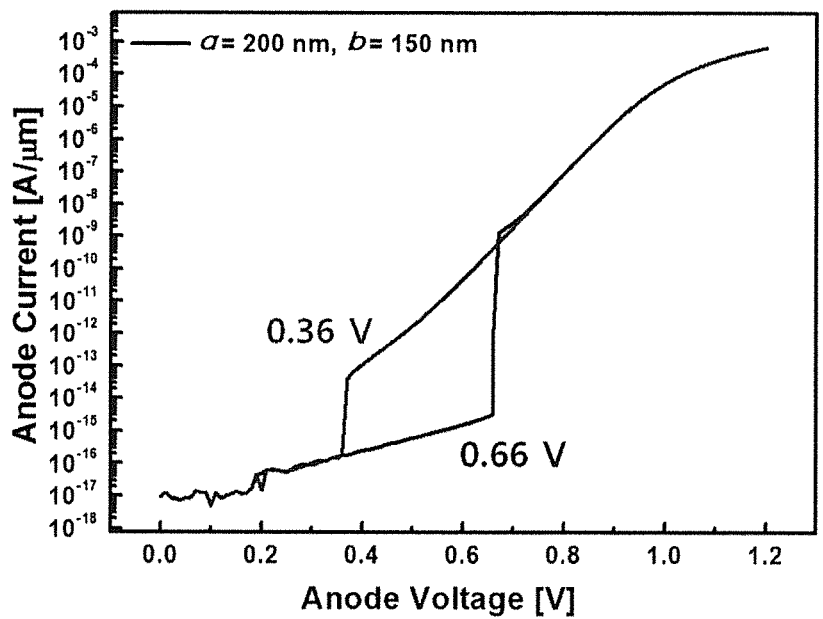
FIG. 7 is a write voltage measurement graph when a memory cell according to an embodiment of the present invention has different lengths of first and second base regions.

FIG. 7 is a write voltage measurement graph when a memory cell according to an embodiment of the present invention has different lengths of first and second base regions.

With reference to FIG. 7, when a voltage was applied to a memory cell having a length of 200 nm in the first base region and the second base region, respectively, the write voltage of the memory cell was measured to be 0.66 V. When a voltage was applied to a memory cell having the first base region with a length of 150 nm which is reduced from and the second base region with a length of 200 nm which is equal to the above memory cell, the write voltage of the memory cell was measured to be 0.36 V. Thus, it can be confirmed that the write voltage of the memory cell is reduced as the length of the base region is reduced.

In this manner, the lengths of the first base region and the second base region can be adjusted to control the write voltage of the memory cell.

The semiconductor memory device according to the embodiments of the present invention described above can be implemented in various types of semiconductor packages. For example, the semiconductor memory device according to the embodiments of the present invention can be packaged by PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like. The packages mounted with the semiconductor memory device according to the embodiments of the present invention can further comprise a controller and/or a logic element for controlling the same.

Figure 8:
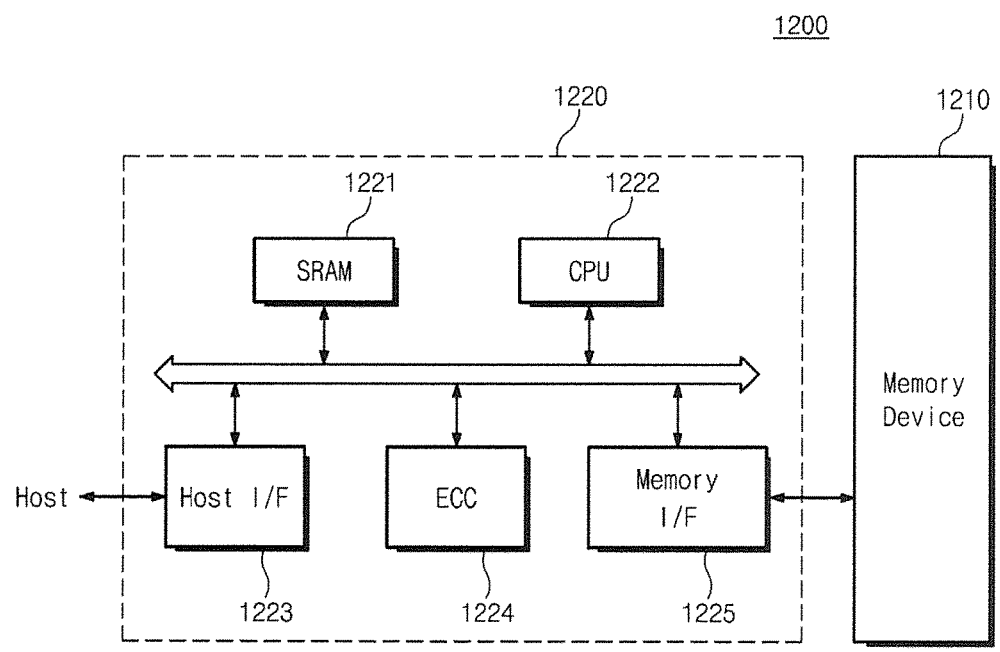
FIG. 8 is a block diagram showing an example of an electronic system including a semiconductor memory device according to the present invention.

FIG. 8 is a block diagram showing an example of an electronic system including a semiconductor memory device based on the technical idea of the present invention.

With reference to FIG. 8, an electronic system 1100 according to an embodiment of the present invention can comprise a controller 1110, an input/output device (I/O) 1120, a memory device 1130, an interface 1140, and a bus 1150. The controller 1110, the input/output device (I/O) 1120, the memory device 1130 and/or the interface 1150 can be connected to each other via the bus 1150. The bus 1150 corresponds to a path through which data is transferred.

The controller 1110 can comprise at least one of a microprocessor, a digital signal process, a microcontroller, and logic elements capable of performing similar functions thereof. The input/output device 1120 can comprise a keypad, a keyboard and a display device, etc. and the memory device 1130 can store data and/or commands, etc. The memory device 1130 can comprise at least one of semiconductor memory devices disclosed in the embodiments of the present invention described above. Further, the memory device 1130 can further comprise other types of semiconductor memory devices (e.g., a DRAM device and/or an SRAM device, etc.).

The interface 1140 can perform the functions of transmitting data to or receiving data from the communication network. The interface 1140 can be in wired or wireless form. For example, the interface 1140 can comprise an antenna or a wired and wireless transceiver. Although not shown, the electronic system 1100 can further comprise an operation memory such as a high-speed DRAM and/or a high-speed SRAM, etc. for improving the operation of the controller 1110.

The electronic system 1100 can be applied to all electronic products such as a personal digital assistant (PDA), a potable computer, a web tablet, a wireless phone, a mobile phone, a digital music player, a memory card or all electronic devices capable of transmitting and/or receiving information in a wireless environment.

Figure 9:
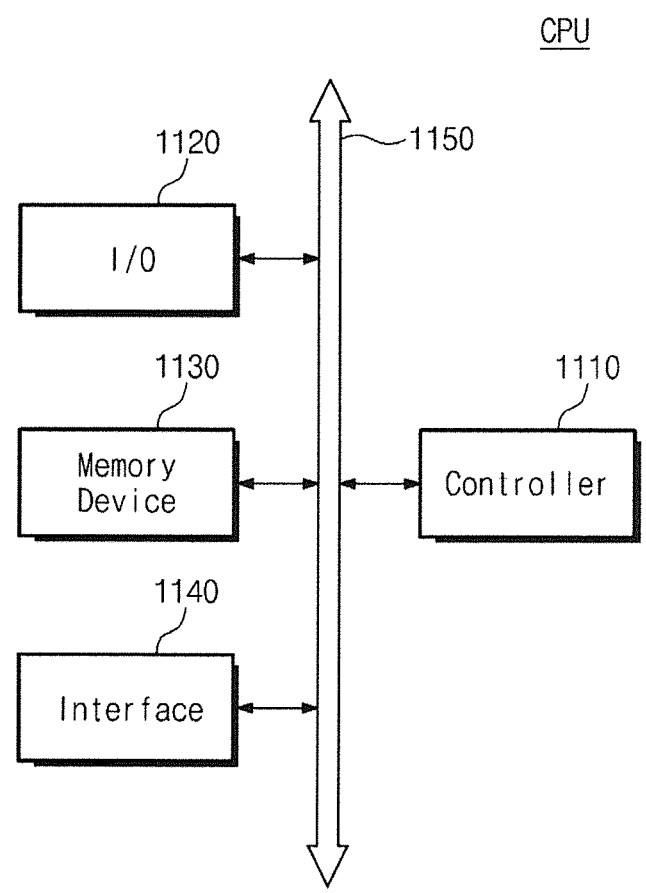
FIG. 9 is a block diagram showing an example of a memory card including a semiconductor memory device according to the present invention.

FIG. 9 is a block diagram showing an example of a memory card including a semiconductor memory device based on the technical idea of the present invention.

With reference to FIG. 9, a memory card 1200 according to an embodiment of the present invention comprises a memory device 1210. The memory device 1210 can comprise at least one of semiconductor memory devices disclosed in the embodiments of the present invention described above. Further, the memory device 1210 can further comprise other types of semiconductor memory devices (e.g., a DRAM device and/or an SRAM device, etc.). The memory card 1200 can comprise a memory controller 1220 that controls the data exchange between a host and the memory device 1210.

The memory controller 1220 can comprise a central processing unit (CPU) 1222 that controls the overall operation of the memory card. Further, the memory controller 1220 can comprise an SRAM used as an operation memory of CPU 1222. In addition, the memory controller 1220 can further comprise a host interface 1223 and a memory interface 1225.

The host interface 1223 can comprise a data exchange protocol between the memory card 1200 and a host. The memory interface 1225 can contact the memory controller 1220 to the memory device 1210. In addition, the memory controller 1220 can further comprise an error correction block code (ECC) 1224.

The error correction block code (ECC) 1224 can detect and correct data errors read from the memory device 1210. Although not shown, the memory card 1200 can further comprise a ROM device that stores code data for interfacing with a host. The memory card 1200 can be used as a potable data memory card. Alternatively, the memory card 1200 can be implemented with a solid state disk (SSD) capable of replacing a hard disk of a computer system.

While the present invention is described in detail with the preferred embodiments, it is to be understood that the scope of the present invention is not limited to the specific exemplary embodiments and is to be limited only by the scope of the appended claims. And, as those skilled in the art, it will be appreciated that many variations and modifications without departing from the scope of the present invention are possible.

What is claimed is:

1. A semiconductor memory device comprising:
    a two-terminal memory cell sequentially joined together with a first high concentration doping region doped with a first conductive type dopant, a second base region doped with a second conductive type dopant, a first base region doped with the first conductive type dopant, and a second high concentration doping region doped with the second conductive type dopant,
    wherein a write voltage of the memory cell is controlled by adjusting the lengths or doping concentrations of the first and second base regions.

2. The semiconductor memory device of claim 1, wherein the write voltage of the memory cell is increased by increasing the lengths or doping concentrations of the first and second base regions.

3. The semiconductor memory device of claim 1, wherein the write voltage of the memory cell is decreased by decreasing the lengths or doping concentrations of the first and second base regions.

4. The semiconductor memory device of claim 1, further comprising: an array having a stack of a plurality of memory cells, wherein the array is formed by alternatively and repeatedly stacking the memory cell with an insulating film.

5. The semiconductor memory device of claim 4, wherein the memory cells in the array comprise a first memory cell and a second memory cell on the first memory cell,
    wherein the lengths of the first base regions of the first and second memory cells are different from each other, and
    wherein the lengths of the second base regions of the first and second memory cells are different from each other.

6. The semiconductor memory device of claim 4, wherein the memory cells in the array comprise a first memory cell and a second memory cell on the first memory cell,
    wherein the doping concentrations of the first base regions of the first and second memory cells are different from each other, and
    wherein the doping concentrations of the second base regions of the first and second memory cells are different from each other.

7. The semiconductor memory device of claim 4,
    wherein the array is provided in a plurality, and
    wherein the plurality of arrays are arranged laterally spaced apart from each other, and trenches are provided between the plurality of arrays.

8. The semiconductor memory device of claim 7,
    wherein the plurality of arrays include first and second arrays adjacent to each other,
    wherein the lengths of the first base regions of the memory cells in the first array are different from the lengths of the first base regions of the memory cells in the second array, and
    wherein the lengths of the second base regions of the memory cells in the first array are different from the lengths of the second base regions of the memory cells in the second array.

9. A method for fabricating a semiconductor memory device comprising:
    a step of preparing a substrate;
    a step of fabricating a stacked structure by alternately and repeatedly stacking a semiconductor layer with an insulating film on the substrate; and
    a step of defining a plurality of arrays by etching the stacked structure to be spaced apart from each other by a trench;
    wherein the semiconductor layer comprises a first high concentration doping region doped with a first conductive type dopant and extended in a first direction, a second base region doped with a second conductive type dopant and extended in the first direction, a first base region doped with a first conductive type dopant and extended in the first direction, and a second high concentration doping region doped with a second conductive type dopant and extended in the first direction,
    wherein the first high concentration doping region, the second base region, the first base region and the second high concentration doping region are sequentially arranged, and
    wherein the trench is extended in a second direction that intersects the first direction.

10. The method of claim 9, wherein each of the arrays includes a plurality of memory cells stacked vertically,
    wherein each of the memory cells is sequentially joined together with the first high concentration doping region, the second base region, the first base region and the second high concentration doping region, and
    wherein a write voltage of each of the memory cells is controlled by adjusting the lengths or doping concentrations of the first and second base regions.

* * * * *